(12) United States Patent
Kimura

(10) Patent No.: US 7,339,404 B2
(45) Date of Patent: Mar. 4, 2008

(54) DEGLITCH CIRCUIT

(75) Inventor: Hiroyuki Kimura, Sendai (JP)

(73) Assignee: Freescale Semiconductor, Inc., Austin, TX (US)

( * ) Notice: Subject to any disclaimer, the term of this patent is extended or adjusted under 35 U.S.C. 154(b) by 52 days.

(21) Appl. No.: 11/508,617

(22) Filed: Aug. 23, 2006

(65) Prior Publication Data

US 2007/0052449 A1    Mar. 8, 2007

(30) Foreign Application Priority Data

Sep. 6, 2005    (JP) .............................. 2005-258374

(51) Int. Cl.
*H03K 9/08*    (2006.01)
*G01R 29/02*    (2006.01)

(52) U.S. Cl. ........................... 327/34; 327/97; 327/551

(58) Field of Classification Search .................. 327/34, 327/97, 551
See application file for complete search history.

(56) References Cited

U.S. PATENT DOCUMENTS 6,535,024 B1 *    3/2003    Rochard ....................... 327/34

7,187,213 B2 *    3/2007    Yoshida et al. ............... 327/34

FOREIGN PATENT DOCUMENTS

| JP | 1995-336201(A) | 12/1995 |
| JP | 1996-237087(A) | 9/1996 |

* cited by examiner

*Primary Examiner*—Quan Tra
*Assistant Examiner*—Colleen O'Toole
(74) *Attorney, Agent, or Firm*—Charles Bergere

(57) ABSTRACT

A deglitch circuit capable of removing noise with low power consumption. Voltage is input to a first inverter, connected to a power supply line via a first current source and grounded via a second current source. The first inverter is grounded via a capacitor and connected to first and second transistors. The gate terminals of these transistors receive a second control voltage, which is lower than the power supply voltage, and a first control voltage, which is higher than the ground level. The second transistor is connected to the ground line via a fourth current source. First voltage is supplied to a first input terminal of the latch circuit via a second inverter. The first transistor is connected to the power supply line via a third current source. Second voltage is supplied to a second input terminal of the latch circuit via the second inverter.

8 Claims, 9 Drawing Sheets

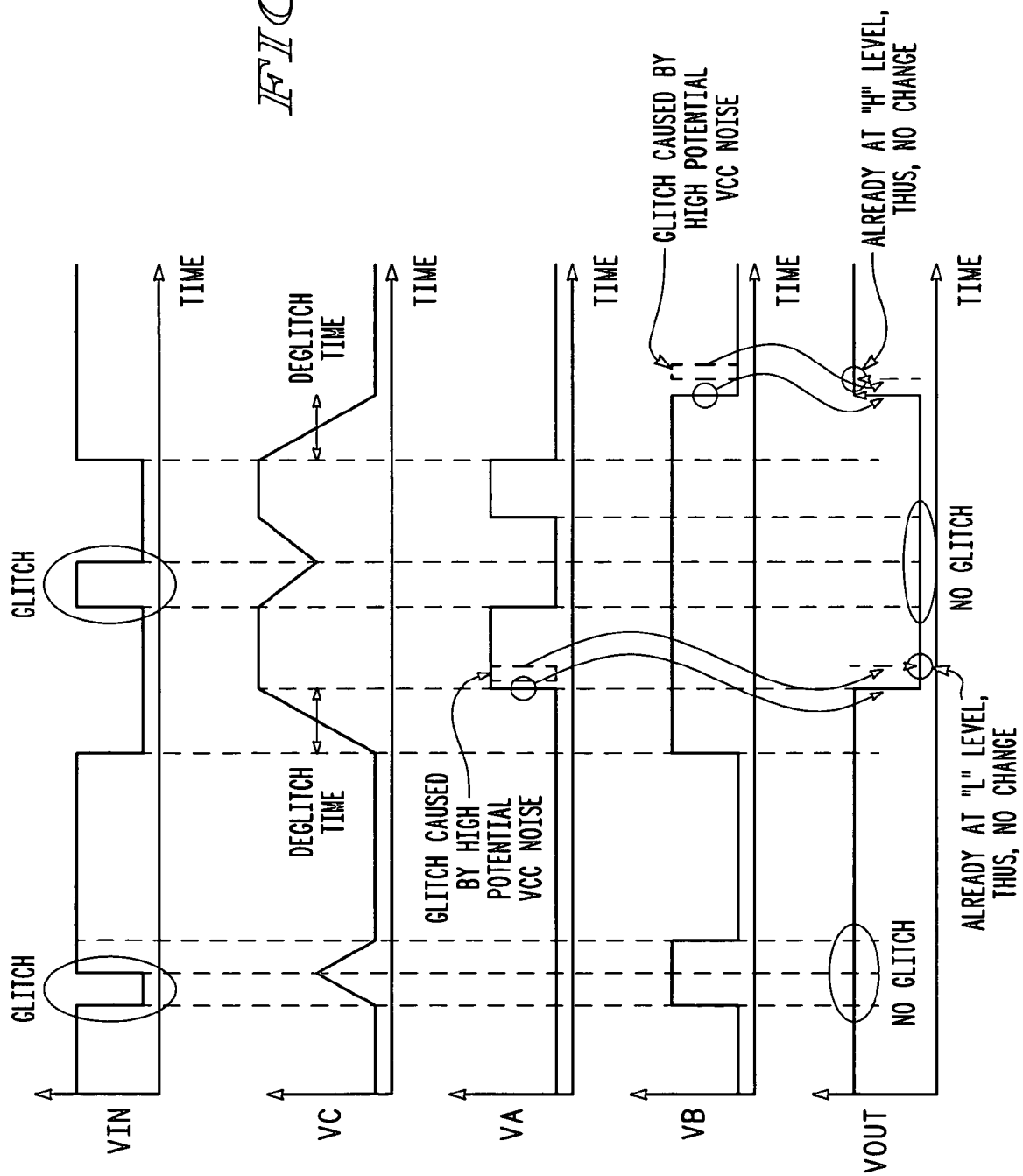

DEGLITCH CIRCUIT

BACKGROUND OF THE INVENTION

The present invention relates to a deglitch circuit for removing noise.

Conventionally, a regulator output is sometimes superimposed with noise, or a so-called glitch. For example, as shown in FIG. 9, when a comparator is used to determine whether a regulator output has an "H" or "L" level with a reference voltage VSCP, the output may be superimposed with a glitch that is greater than the reference voltage VSCP. In such a case, a deglitch circuit is used as a filter circuit for removing the glitch. A Schmitt trigger circuit may be used as a deglitch circuit for removing a glitch (for example, Japanese Laid-Open Patent Publication No. 8-237087). The configuration of this deglitch circuit will be described with reference to FIGS. 10A and 10B. As shown in FIG. 10A, the deglitch circuit includes an inverter, an RC filter, and a Schmitt trigger circuit. The RC filter functions as a lowpass filter to remove noise of a predetermined frequency or greater. The Schmitt trigger circuit is typically formed by a circuit that is shown in FIG. 10B. Such Schmitt trigger circuit has hysteresis characteristics as shown in FIG. 10C.

If noise occurs in a power supply line of the Schmitt trigger circuit, as shown in FIG. 10D, the voltage VOUT of the output signal of the deglitch circuit will be repeatedly shifted between "H" and "L" levels in the vicinity of the threshold of the Schmitt trigger circuit. In other words, noise cannot be removed when power supply noise is large. As is obvious from the hysteresis characteristics in FIG. 10C, power consumption is also increased if noise occurs on the power supply line in the vicinity of the threshold of the Schmitt trigger circuit.

Japanese Laid-Open Patent Publication No. 7-336201 describes an improved configuration of the deglitch circuit as shown in FIGS. 10A to 10D. This configuration will be described with reference to FIGS. 11A and 11B. The deglitch circuit as shown in FIG. 11A further includes a NAND circuit. Once the output signal of this circuit is shifted between "H" and "L" levels, the voltage VC is reduced to the ground level. Therefore, even if noise occurs on the power supply line in the vicinity of the threshold of the Schmitt trigger circuit, the output signal voltage VOUT of the deglitch circuit will not be repeatedly changed between "H" and "L" levels.

However, the deglitch circuit shown in FIG. 11A is also formed by a Schmitt trigger circuit. Thus, power supply current will continue to be flow in the hysteresis range. This will increase power consumption. In particular, when change in the voltage VC is gradual, the power consumption becomes outstanding. Additionally, the time constant of the RC filter must be determined in accordance with the noise situation. However, if the time constant is once determined, it cannot be changed. This makes is difficult to flexibly cope with various situations. When the voltage VC changes, current will flow in the vicinity of the threshold voltage as shown in FIG. 12, and power will be consumed. Therefore, if the voltage gradually changes as in the deglitch circuit shown in FIGS. 10 and 11, the power consumption will increase.

SUMMARY OF THE INVENTION

It is an object of the present invention to provide a deglitch circuit enabling the removal of noise with low power consumption in various situations.

One aspect of the present invention is a deglitch circuit for removing a glitch. The deglitch circuit includes a first inverter connected to a power supply line, which supplies power supply voltage, via a first current source and to a ground line via a second current source. The first inverter receives an input signal. A capacitor is connected to an output terminal of the first inverter and to the ground line. A first transistor includes a source terminal, connected to the capacitor, and a drain terminal, connected to the power supply line via a third current source having a current value smaller than that of the second current source. The first transistor is biased at a first control voltage that is higher than ground potential. A second transistor includes a source terminal, connected to the capacitor, and a drain terminal, grounded via a fourth current source having a current value smaller than that of the first current source. The second transistor is biased at a second control voltage that is lower than the power supply voltage. A latch circuit receives outputs from the drain terminals of the first and second transistors via the second and third inverters, respectively.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 4 is a diagram showing changes of an input signal, voltage, and an output signal of the deglitch circuit;

DETAILED DESCRIPTION OF THE PREFERRED EMBODIMENTS

First Embodiment

Figure 1:
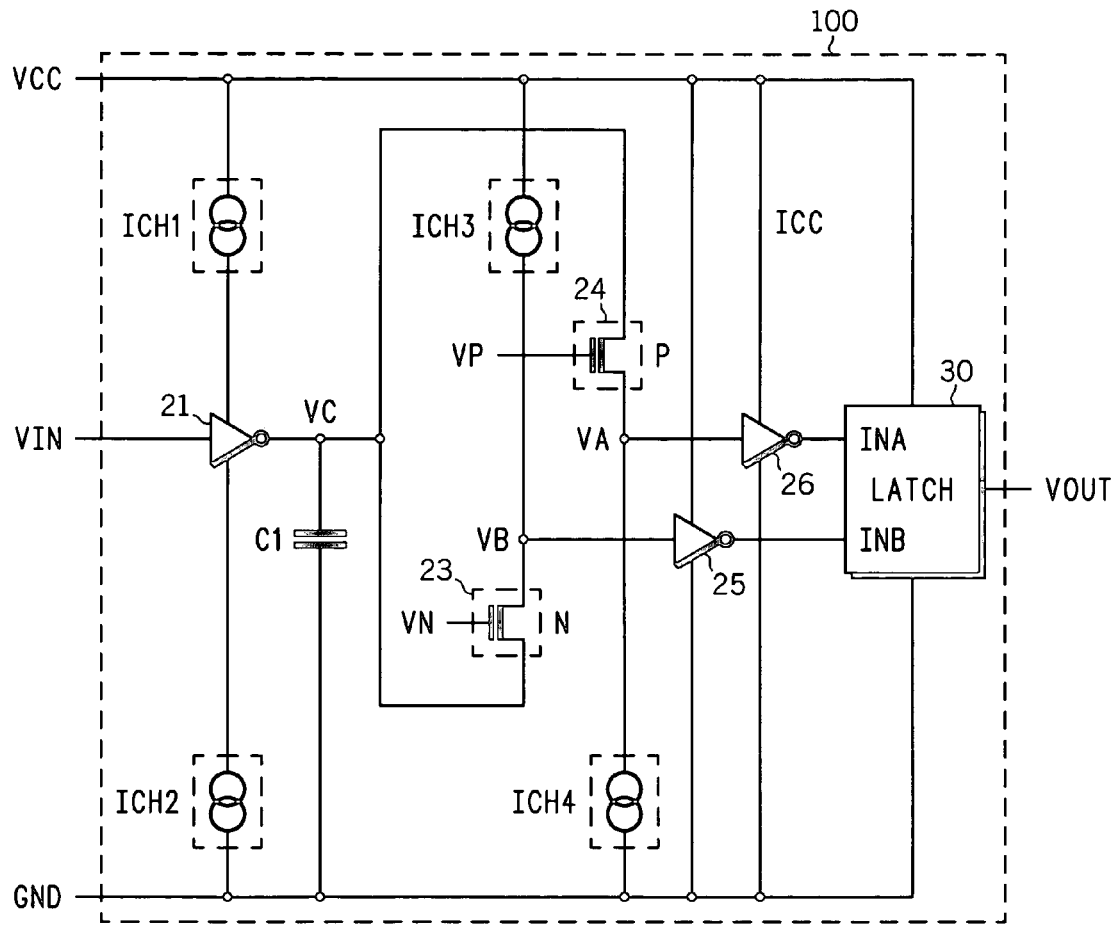
FIG. 1 is a circuit diagram of a deglitch circuit according to a first embodiment of the present invention.

A first embodiment of the present invention will now be described with reference to FIGS. 1 to 6. As shown in FIG. 1, a deglitch circuit 100 of the first embodiment receives voltage VIN of an input signal and outputs voltage VOUT of an output signal.

The deglitch circuit 100 includes an inverter 21, which functions as a first inverter. The input signal voltage VIN is received by the deglitch circuit 100 at an input terminal of the inverter 21. The power supply terminal of the inverter 21 is connected, via a first current source ICH1, to a power supply line, which supplies power supply voltage VCC. The ground terminal of the inverter 21 is grounded via a second current source ICH2. The output terminal of the inverter 21 is grounded via a capacitor C1. The voltage at a node of the output terminal is denoted by VC. The node is connected to an input terminal (source terminal) of a transistor 23, which functions as a first transistor, and to an input terminal (source terminal) of a transistor 24, which functions as a second transistor. The voltage VC is supplied to these input terminals.

The transistor 23 is an N-channel MOS transistor, the gate terminal of which receives a first control voltage VN. The first control voltage VN is higher than the ground level by a predetermined voltage. The source terminal of the transistor 23 is connected to the output terminal of the inverter 21 and supplied with the voltage VC. The drain terminal of the transistor 23 is connected to the power supply line via a third current source ICH3. The current value of the third current source ICH3 is set to a value that is sufficiently smaller than the current value of the second current source ICH2. Voltage VB of this drain terminal (first transistor drain terminal voltage) is supplied to a second input terminal INB of a latch circuit 30 via an inverter 25, which functions as a second inverter.

The transistor 24 is a P-channel MOS transistor, the gate terminal of which receives second control voltage VP. The second control voltage VP is set to a voltage that is lower than the power supply voltage VCC by a predetermined voltage. The source terminal of the transistor 24 is connected to the output terminal of the inverter 21 to receive the voltage VC. The drain terminal of the transistor 24 is connected to the ground line via a fourth current source ICH4. A current value of the fourth current source ICH4 is set to a value that is sufficiently smaller than the current value of the first current source ICH1. Voltage VA of the drain terminal (second transistor drain terminal voltage) is supplied to a first input terminal INA of the latch circuit 30 via an inverter 26, which functions as a third inverter.

The inverters 25 and 26 each have a power supply terminal connected to the power supply line and a ground terminal connected to the ground line.

The latch circuit 30 has a known configuration. The latch circuit 30 used in the first embodiment will now be described with reference to FIG. 2. The latch circuit 30 of the first embodiment includes inverters 31, 34, and 35, a first NOR circuit 32, and a second NOR circuit 33.

An input signal received at the first input terminal INA is input to the inverter 31. An output signal from the inverter 31 is received at one of the input terminals of the first NOR circuit 32. The other input terminal of the first NOR circuit 32 receives an output of the second NOR circuit 33. An output signal of the first NOR circuit 32 is received at one of the input terminals of the second NOR circuit 33.

The other input terminal of the second NOR circuit 33 receives an input signal that is received at the second input terminal INB of the latch circuit 30. An output signal of the second NOR circuit 33 is input to the inverter 34 and to the other input terminal of the first NOR circuit 32. An output signal of the inverter 34 is input to the inverter 35, and an output signal of the inverter 35 is output as an output signal of the latch circuit 30. The inverters 31, 34, and 35 and the NOR circuits 32 and 33 each have a power supply terminal connected to a high-potential DVDD line and a ground terminal connected to a low-potential DVSS line. Accordingly, when the output signal (the output signal voltage VOUT of the deglitch circuit 100) has an "H" level, the latch circuit 30 shifts the output signal if both the first and second input signals are shifted to an "L" level. When the output signal is at a "L" level, the latch circuit 30 shifts the output signal if both the first and second input signals are shifted to an "H" level.

Figure 2:
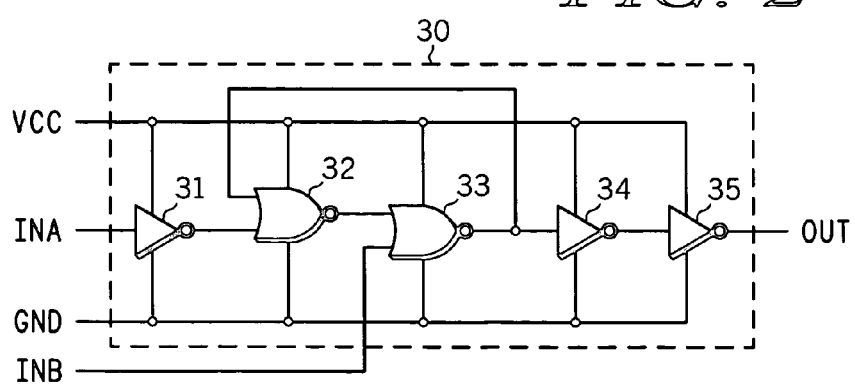
FIG. 2 is a circuit diagram of a latch circuit used in the deglitch circuit.
Figure 3:
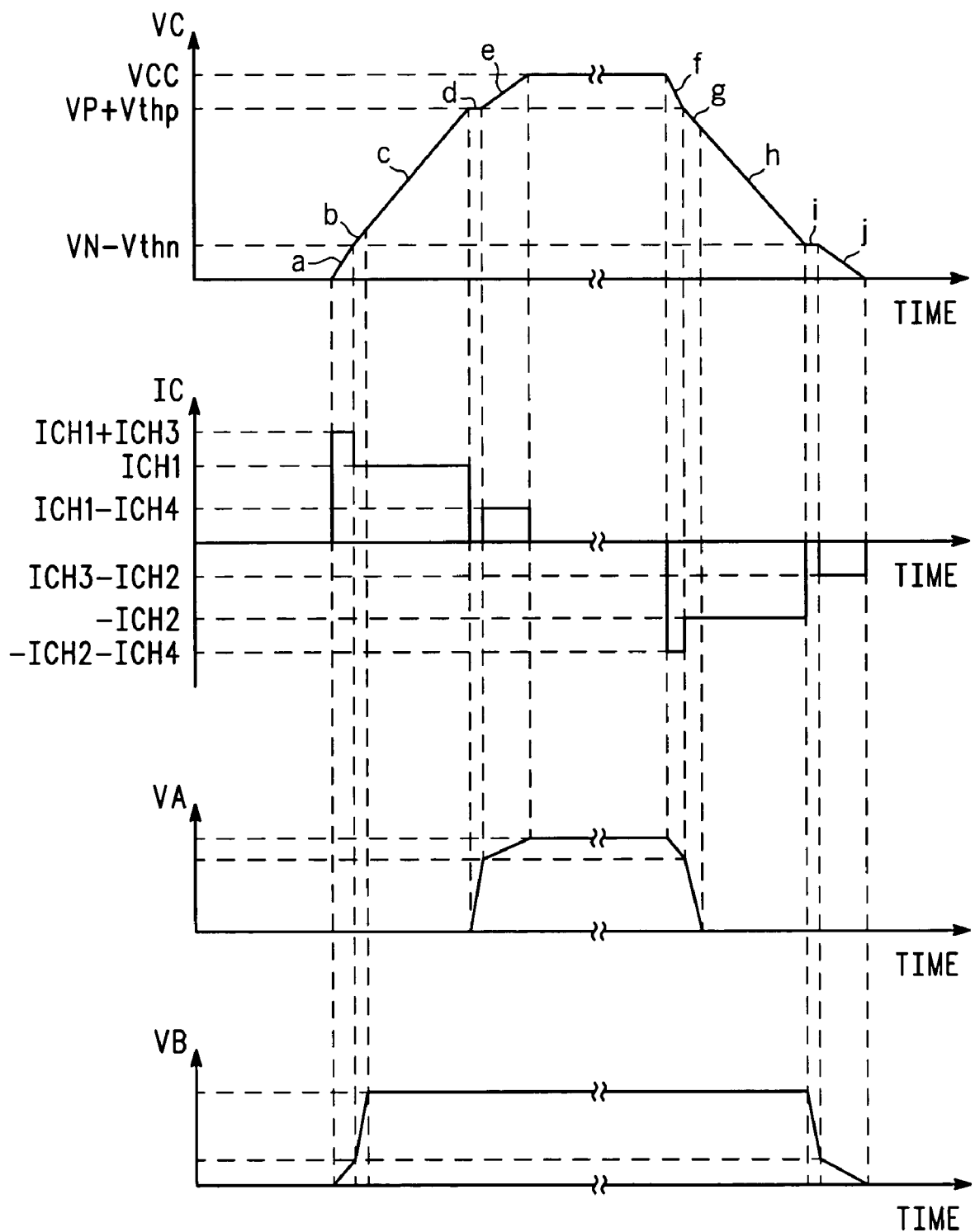
FIG. 3 is a voltage diagram and a current diagram illustrating operation of the deglitch circuit.

The operation of the deglitch circuit 100 according to the first embodiment will now be described with reference to FIGS. 1 to 3. In this description, the operation of the deglitch circuit 100 will be divided into stages (a) to (j) in accordance with changes in the voltage VC at the output terminal of the inverter 21. The stages (a) to (e) each correspond to when the input signal shifts from an "H" level to an "L" level, and the stages (f) to (j) correspond to when the input signal shifts from an "L" level to an "H" level.

[When Input Signal Voltage VIN Varies from "H" Level to "L" Level]

First, a case in which the input signal voltage VIN shifts from an "H" level to an "L" level will be described. In this case, the voltage VC at the output terminal of the inverter 21 shifts from an "L" level to an "H" level.

$VC < (VN - Vthn)$      Stage (a):

When the input signal shifts to an "L" level, the voltage VC at the output terminal of the inverter 21 is increased. At this time, the voltage at the source terminal of the transistor 23 is lower than a value (VN−Vthn) that is obtained by subtracting the threshold voltage Vthn of the transistor 23 from the first control voltage VN. Therefore, the transistor 23 is in an ON state. The voltage VC at the output terminal of the inverter 21 is low. Thus, the source voltage of the transistor 24 is lower than a value (VP+Vthp) that is obtained by adding the threshold voltage Vthp of the transistor 24 to the gate voltage (to which the second control voltage VP is connected). Therefore, the transistor 24 is in an OFF state.

Accordingly, current from the first current source ICH1 is first supplied to the capacitor C1 via the inverter 21. Additionally, current from the third current source ICH3 is also supplied to the capacitor C1 via the transistor 23. Thus, the capacitor C1 is charged with the current from the first and third current sources ICH1 and ICH3. This increases the voltage VC.

In this state, the transistor 24 is ON. Thus, the voltage VB of the transistor 24 is substantially equal to the voltage VC of the capacitor C1. Therefore, the voltage VB is gradually increased as the voltage VC increases.

Stage (a) continues until the voltage VC becomes a voltage (VN−Vthn) that is lower than the first control voltage VN by the threshold voltage Vthn of the transistor 23. An inclination Sa of the change in the voltage VC is represented by the equation of Sa=(ICH1+ICH3)/C, where C is the electrostatic capacitance of the capacitor C1.

Accordingly, the duration time Ta of stage (a) is obtained from the equation of Ta=(VN−Vthn)/Sa.

$$VC=(VN-Vthn) \quad \text{Stage (b):}$$

When the voltage VC increases to voltage (VN−Vthn), the first control voltage VN at the gate terminal of the transistor 23 becomes equal to the voltage at the source terminal. Thus, the transistor 23 is turned OFF. In this case, the voltage VB at the drain terminal of the transistor 23 is raised by the third current source ICH3 to the power supply voltage VCC. The voltage VB is input to the latch circuit 30 via the inverter 25. An "L" level is input to the second input terminal INB of the latch circuit 30.

In this state, the transistors 23 and 24 are OFF. Therefore, all of the electric current from the first current source ICH1 flows to the capacitor C1. Accordingly, an inclination Sb of the change in the voltage VC is represented by the equation of Sb=Sc=ICH1/C. The duration time of this stage (b) is the time in which the drain terminal of the transistor 23 is charged with the voltage VB. The charge of the drain terminal of the transistor 23 is performed instantaneously. Hence, the duration time Tb of stage (b) is approximately zero.

$$(VN-Vthn)<VC<(VP+Vthp) \quad \text{Stage (c):}$$

In this stage (c), the transistors 23 and 24 are both held in an OFF state. The capacitor C1 is supplied with electric current from the first current source ICH1 via the inverter 21. This gradually increases the voltage VC. The stage (c) continues until the voltage VC becomes a voltage (VP+Vthp) that is higher than the second control voltage VP by the threshold voltage Vthp of the transistor 24. In this state, an inclination Sc of the change in the voltage VC is represented by the equation Sc=ICH1/C like the inclination Sb in the stage (b). The duration time Tc of stage (c) is obtained from the equation of Tc=(VP−VN+Vthn+Vthp)/Sc.

$$VC=(VP+Vthp) \quad \text{Stage (d):}$$

When the voltage VC becomes equal to voltage (VP+Vthp), the transistor 24 is turned ON. Thus, as shown in FIG. 3, the voltage VA is raised by the voltage VC by a differential current between the first current source ICH1 and the fourth current source ICH4.

Figure 5A:
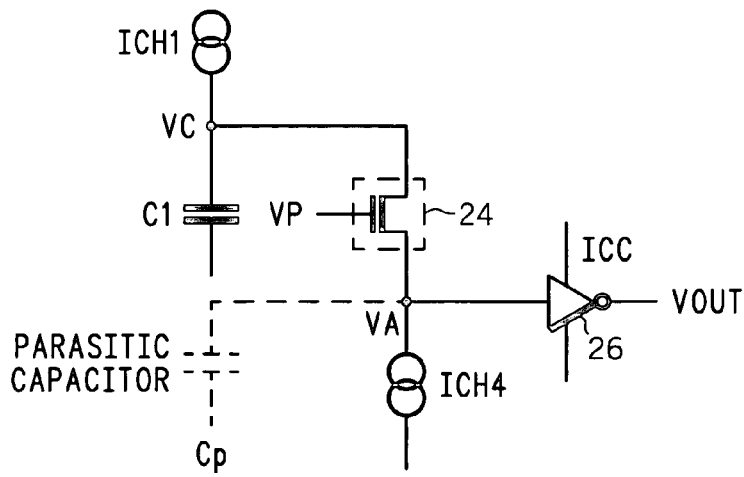
FIG. 5A is a circuit diagram of the deglitch circuit at stage (d)
Figure 5B:
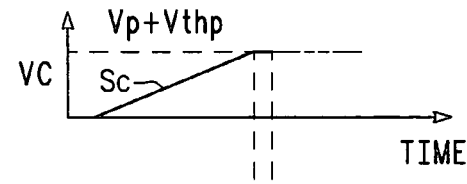
FIG. 5B is a graph showing changes of voltage VC.
Figure 5C:
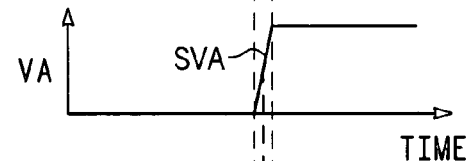
FIG. 5C is a graph showing changes of voltage VA.

As shown in FIG. 5A, the transistor 24 has a parasitic capacitance Cp. However, the parasitic capacitance Cp is much smaller than the electrostatic capacitance C of the capacitor C1. In addition to the capacitance of the transistor 24, the parasitic capacitance Cp includes capacitance of the drain of the transistor 24, the fourth current source ICH4, the input of the inverter 26, and the wiring connecting these devices. The current value of the fourth current source ICH4 is smaller than that of the first current source ICH1. Therefore, as shown in FIG. 5C, the voltage VA rises rapidly. When the inclination Sc of the change in the voltage VC in stage (c) shown in FIG. 5B is compared with the inclination SVA of the change in the voltage VA shown in FIG. 5C, the ratio therebetween is represented by the equation of SVA/Sc=C/Cp.

Figure 5D:
FIG. 5D shows power consumption of a third inverter.
Figure 9:
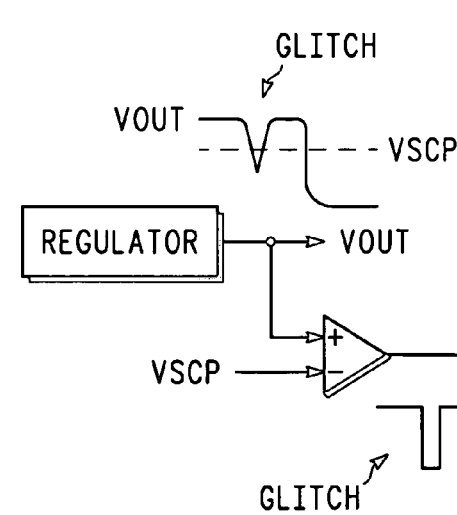
FIG. 9 is a diagram illustrating a glitch.

The voltage VA is input to the latch circuit 30 via the inverter 26. An "L" level is input to the first input terminal INA of the latch circuit 30. As a result, the output of the latch circuit 30 shifts to an "H" level within a short period of time when the voltage VC becomes the voltage (VP+Vthp). Accordingly, the power consumption in the inverter 26 changes within a short period of time as shown in FIG. 5D. Thus, the power consumption during such a transition is reduced.

The inclination Sd of the change in the voltage VC in stage (d) is zero. Thus, the stage (d) is performed instantaneously. The duration time Td of stage (d) is approximately zero.

$$(VP+Vthp)<VC \quad \text{Stage (e):}$$

In this stage, the capacitor C1 is also charged with current from the first current source ICH1 via the inverter 21. The transistor 24, which is kept ON, is supplied with current via the fourth current source ICH4. Therefore, the capacitor C1 is charged with current of (ICH1−ICH4), and the voltage VC is raised to the power supply voltage VCC. The inclination Se of the change in the voltage VC at this time is represented by the equation of Se=(ICH1−ICH4)/C. The duration time Te of the stage (e) is represented by the equation of Te=(VCC−VP−Vthp)/Se.

In the first embodiment, when the voltage VIN of the input signal is shifted from an "H" level to an "L" level, a glitch that does not exceed the second control voltage VP is removed. The time for the voltage VC to be increased to turn ON the transistor 24 is dead time. Therefore, the duration time Ta to Td (deglitch time) is required to remove the glitch.

Since the duration time Tb and Td is approximately zero, the deglitch time is obtained by adding the duration time Ta and the duration time Tc. When the voltage (VN−Vthn) is close to zero, that is, when the first control voltage VN is the same value as the threshold voltage Vthn of the transistor 23, the duration time Ta is approximately zero. Thus, the time required for removing the glitch is the duration time Tc. Accordingly, in the first embodiment, in order to increase the dead time to enable as much glitch as possible to be removed, (VN−Vthn) is set to zero. That is, the first control voltage VN is set to a value that is higher than the ground level (ground potential) by the threshold voltage Vthn of the transistor 23. However, in practice, in order to enable the first current source ICH1 to operate even when VC=(VN−Vthn) is satisfied, the first control voltage VN is set to a value that is higher than the ground level by the sum of the threshold voltage Vthn of the transistor 23 and the compliance voltage of the first current source ICH1.

[When Input Signal Voltage VIN Shifts from "L" Level to "H" Level]

A case in which the input signal voltage VIN shifts from an "L" level to an "H" level will now be described. In this case, the voltage VC at the output terminal of the inverter 21 is shifted from an "H" level to an "L" level.

$$VCC>VC>(VP+Vthp) \quad \text{Stage (f):}$$

When the input signal voltage VIN is shifted from an "L" level to an "H" level, the voltage VC drops from the power supply voltage VCC.

More specifically, the voltage VC is grounded via the inverter 21 and the second current source ICH2. The voltage VC is further grounded via the transistor 24 in the ON state and the fourth current source ICH4. Thus, the capacitor C1 is discharged and the voltage VC gradually decreases. The voltage VA also decreases as with the voltage VC decreases. The inclination Sf of the change in the voltage VC is obtained by the equation of Sf=−(ICH2+ICH4)/C. The duration time Ta of stage (f) is obtained by the equation of Ta=|(VCC−VP−Vthp)/Sf|.

$$VC=(VP+Vthp) \quad \text{Stage (g):}$$

In this case, the voltage at the source terminal of the transistor 24 becomes equal to the sum of the second control voltage VP at the gate terminal of the transistor 24 and the threshold voltage of the transistor 24. Thus, the transistor 24 is turned OFF. Therefore, the voltage VA at the drain terminal of the transistor 24 is grounded via the fourth current source ICH4 and becomes null. The voltage VA is input to the latch circuit 30 via the inverter 26. An "H" level is input to the first input terminal INA of the latch circuit 30.

The transistors 23 and 24 are in the OFF state at this time. Therefore, the capacitor C1 is discharged via the inverter 21 and the second current source ICH2. This decreases the voltage VC. Accordingly, the inclination Sg of the change in the voltage VC is represented by the equation of Sg=−ICH2/C. The duration time of stage (g) is the discharge time of the voltage VA at the drain terminal of the transistor 24. This discharge is performed instantaneously. Hence, the duration time Tg of the stage (g) is approximately zero.

$$(VP-Vthp)>VC>(VN-Vthn) \quad \text{Stage (h):}$$

In this case, the transistors 23 and 24 are both kept in the OFF state. In addition, the voltage VA is zero. The capacitor C1 is discharged via the inverter 21 and the second current source ICH2. This decreases the voltage VC. Accordingly, the inclination Sh of the change in the voltage VC is obtained by the equation of Sh=−ICH2/C like the inclination Sg of stage (g). The duration time Th of the stage (h) is obtained by the equation of Th=|(VP−VN+Vthn+Vthp)/Sh|.

$$VC=(VN-Vthn) \quad \text{Stage (i):}$$

When the voltage VC drops to the voltage (VN−Vthn), the transistor 23 is turned ON. Further, the voltage VB, which has been raised by the third current source ICH3, decreases. Like the parasitic capacitance Cp of the transistor 24 described above, the parasitic capacitance of the transistor 23 is also sufficiently smaller than the electrostatic capacitance C of the capacitor C1. In addition to the capacitance of the transistor 23, the parasitic capacitance includes the capacitance of the drain of the transistor 23, the third current source ICH3, the inverter 25, and wirings connecting these devices. The current value of the third current source ICH3 is smaller than the current value of the second current source ICH2. Therefore, the voltage VB drops rapidly. This voltage VB is input to the latch circuit 30 via the inverter 25.

The inclination Si of the change in the voltage VC in stage (i) is zero. Hence, the duration time Ti of stage (i) is approximately zero.

$$VC<VN-Vthn \quad \text{Stage (j):}$$

Since the transistor 23 is in the ON stage, the capacitor C1 is supplied with current from the third current source ICH3 via the transistor 23. Further, the capacitor C1 is discharged via the inverter 21 and the second current source ICH2. Accordingly, the inclination Sj of the change in the voltage VC is obtained from the equation of Sj=(ICH3−ICH2)/C, and the duration time Tj of stage (j) is obtained from the equation of Tj=|(VN−Vthn)/Sj|.

In the first embodiment, when the input signal voltage VIN shifts from an "L" level to an "H" level, a glitch that does not exceed the first control voltage VN may be removed. The time for the voltage VC to be increased to turn OFF the transistor 23 is dead time. Therefore, the duration time Tf to Ti (deglitch time) is required to remove a glitch.

Since the duration time Tg and Ti is approximately zero, the deglitch time is obtained by adding the duration time Tf and the duration time Th. When the voltage (VP+Vthp) is close to zero, the duration time Tf is approximately zero, and hence the deglitch time is equal to the duration time Th. Therefore, in this embodiment, in order to increase the dead time to enable as much glitch as possible to be removed, (VN+Vthn) is set to zero. That is, the second control voltage VP is set to a value that is lower than the power supply voltage VCC by the threshold voltage Vthp of the transistor 24. However, in practice, in order to enable the first current source ICH2 to operate even when VC=(VP+Vthp) is satisfied, the second control voltage VP is set to a value that is lower than the power supply voltage by the sum of the threshold voltage Vthp of the transistor 24 and the compliance voltage of the second current source ICH2.

(Glitch Removal Operation)

An operation for removing a glitch will now be described with reference to FIG. 4.

For example, when the input signal voltage VIN has an "H" level, a short glitch may occur and shift the voltage VIN to an "L" level. In such a case, since the glitch is short, the voltage VC will only rise to an intermediate value that is higher than (VN−Vthn) but lower than (VP+Vthp). In this state, the voltage VB becomes equal to the power supply voltage VCC, and an "L" level signal is input to the second input terminal INB of the latch circuit 30. Since the voltage VA is grounded, an "H" level signal is input to the first input terminal INA of the latch circuit 30. In this case, the output of the latch circuit 30 does not shift because the signal voltages VA and VB both do not shift to an "H" level. Accordingly, the output signal voltage VOUT of the deglitch circuit 100 is kept at an "H" level. Thus, the deglitching is performed when the input signal voltage VIN has an "H" level.

A case in which the input signal voltage VIN is shifted from an "H" level to an "L" level will next be described. In this case, the voltage VC is raised through the above-described stages (a) to (e). The voltage VB is also raised and shifted to an "H" level when the input signal voltage VIN changes. The voltage VA also shifts to an "H" level after the deglitch time elapses. The output signal voltage VOUT of the deglitch circuit 100 changes in accordance with the output of the latch circuit 30.

The downward dotted arrow in FIG. 4 shows a case in which noise occurs in the power supply voltage VCC immediately after the deglitch time elapses and thus decreases the voltage VA. In this case, the voltage VA has already been shifted to an "H" level thereby shifting the output of the deglitch circuit 100 to an "L" level. Thus, the voltage VB remains at an "H" level even if the voltage VA falls to an "L" level. Therefore, there is no change in the output signal voltage VOUT of the latch circuit 30. Accordingly, the output signal voltage VOUT of the deglitch circuit 100 remains at an "L" level, and the glitch can be removed.

In another example, when the input signal voltage VIN has an "L" level, a short glitch may occur and shift the voltage VIN to an "H" level. In this case, since the glitch is short, the voltage VC will fall to an intermediate value that is lower than (VP+Vthp) but higher than (VN−Vthn). At this time, the voltage VA becomes equal to the ground potential GND, and an "L" level signal is input to the first input terminal INA of the latch circuit 30. Since the voltage VB is equal to the power supply voltage VCC, an "H" level signal is input to the second input terminal INB of the latch circuit 30. Accordingly, the output signal voltage VOUT of the deglitch circuit 100 remains at an "L" level.

Subsequently, when the input signal voltage VIN is shifted from an "L" level to an "H" level, the voltage VC is decreased through the above-described stages (f) to (j). The voltage VA also falls to an "L" level at the same timing as when the input signal voltage VIN changes. The voltage VB also shifts to an "L" level after the deglitch time elapses. The output signal voltage VOUT of the deglitch circuit 100 changes in accordance with the output of the latch circuit 30.

The upward dotted arrow in FIG. 4 shows a case in which noise occurs in the power supply voltage VCC after the deglitch time elapses and this increases the voltage VB. In this case, the output of the deglitch circuit 100 has already been shifted to an "H" level. Thus, the voltage VA remains at an "L" level even if the voltage VB increases to an "H" level. Hence, the output signal voltage VOUT of the latch circuit 30 does not change. Accordingly, the output signal voltage VOUT of the deglitch circuit 100 remains at an "H" level, and a glitch can be removed.

The first embodiment has the advantages described below.

(1) In the first embodiment, the inverter 21 receiving the input signal of the deglitch circuit 100 is connected to the power supply voltage VCC via the first current source ICH1 and grounded via the second current source ICH2. The output terminal of the inverter 21 is grounded via the capacitor C1 and grounded via the transistor 24 and the fourth current source ICH4. Further, the output terminal of the inverter 21 is supplied with the power supply voltage VCC via the transistor 23 and the third current source ICH3. The voltage VA at the connection node between the transistor 24 and the fourth current source ICH4 is supplied to the first input terminal INA of the latch circuit 30 via the inverter 26. The voltage VB at the connection node between the transistor 23 and the third current source ICH3 is supplied to the second input terminal INB of the latch circuit 30 via the inverter 25. When the transistors 23 and 24 are switched, the first current source is used to charge the capacitor C1. When the input signal voltage VIN is shifted, the voltage VOUT of the output signal is switched after the signal voltages VA and VB both change. Even if a glitch occurs in the input signal voltage VIN and changes the voltage VC, the voltage VOUT of the output signal does not change as long as both of the signal voltages VA and VB do not change. This ensures the removal of the glitch.

The parasitic capacitance Cp of the transistor 24 is sufficiently smaller than the electrostatic capacitance C of the capacitor C1, and the current value of the fourth current source ICH4 is smaller than the current value of the first current source ICH1. Therefore, in stage (d) in which the output signal voltage VOUT shifts from an "L" level to an "H" level, the voltage VA changes within a short period of time. This inverts the output of the inverter 26 within a short period of time. As a result, the current supplied to the inverter 26 is reduced when the voltage VOUT of the output signal changes, and the power consumption is lowered.

Further, the parasitic capacitance Cp of the transistor 24 is sufficiently smaller than the electrostatic capacitance C of the capacitor C1, and the current value of the third current source ICH3 is smaller than the current value of the second current source ICH2. Therefore, in stage (i) in which the output signal voltage VOUT changes from an "H" level to an "L" level, the voltage VB changes within a short period of time. As a result, the current supplied to the inverter 26 is reduced when the voltage VOUT of the output signal changes, and the power consumption is lowered.

(2) In the first embodiment, a first control voltage VN, which is higher than the ground level by a predetermined voltage, is applied to the gate terminal of the transistor 23. Further, a second control voltage VP, which is lower than the power supply voltage VCC by a predetermined voltage, is applied to the gate terminal of the transistor 24. Accordingly, the time constant of the circuit can be varied by changing the first and second control voltages VN and VP. This makes it possible to remove the glitch by using a more appropriate time constant depending on the noise situation.

[Specific Example of Circuit Configuration]

Figure 6:
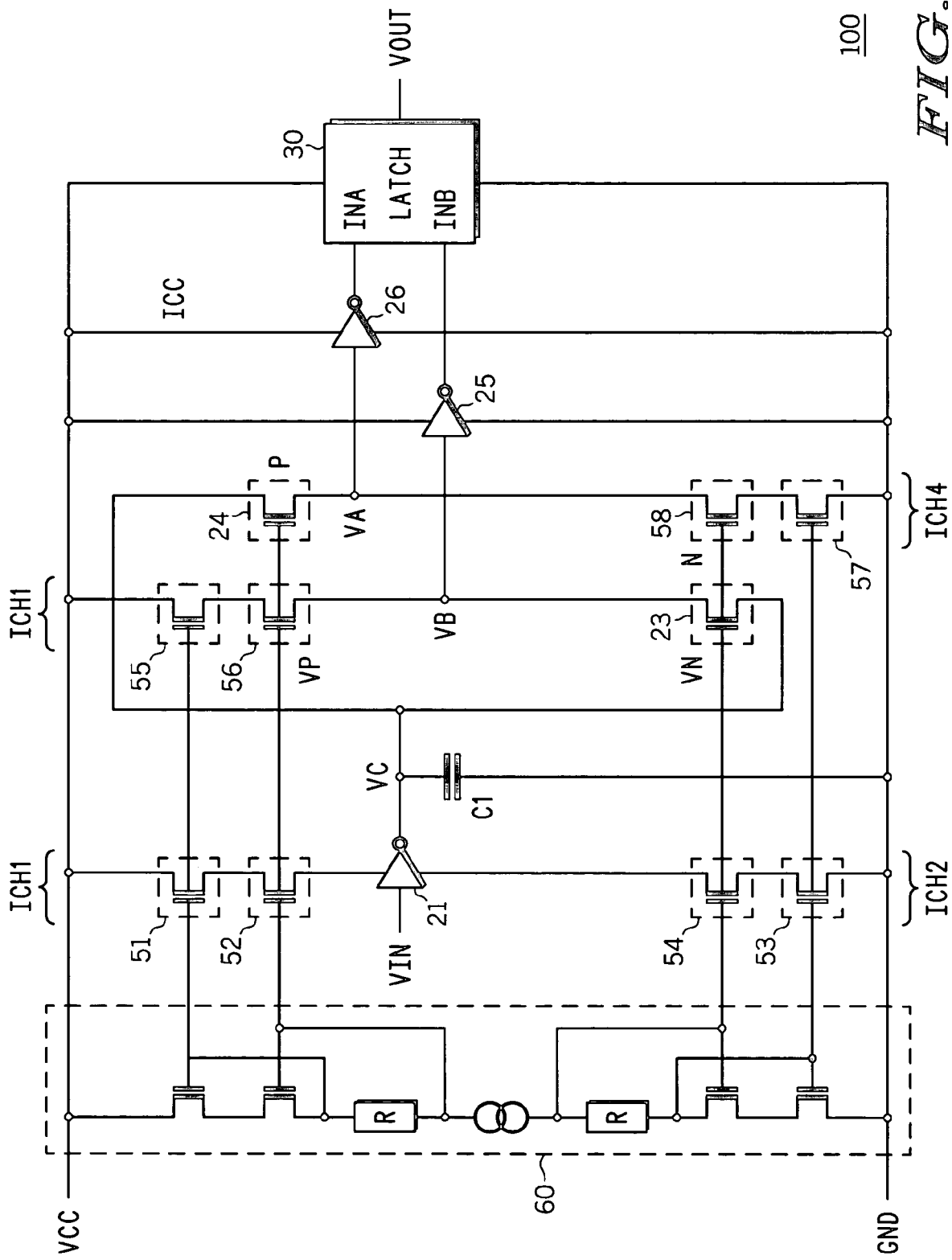
FIG. 6 is a circuit diagram showing the deglitch circuit of the first embodiment.

FIG. 6 is a circuit diagram showing a specific example of the configuration the first embodiment. The first current source ICH1 is formed by connecting transistors 51 and 52 in series. The second current source ICH2 is formed by connecting transistors 53 and 54 in series. The third current source ICH3 is formed by connecting transistors 55 and 56 in series. The fourth current source ICH4 is formed by connecting transistors 57 and 58 in series. The transistors 51, 52, 55, and 56 are P-channel MOS transistors, while the transistors 53, 54, 57, and 58 are N-channel MOS transistors. In this embodiment, the threshold voltage of the transistors 51 to 58 is set to be Vthn=Vthp (=Vth). A bias circuit 60 applies a predetermined voltage to the gate terminals of the transistors 51 to 58. This bias circuit 60 is connected between the power supply line and the ground line.

The gate terminal of the transistor 55 that is arranged on the power supply line side of the third current source ICH3 is connected to the gate terminal of the transistor 51 that is arranged on the power supply line side of the first current source ICH1. The gate terminal of the transistor 56, which is arranged on the opposite side of the third current source ICH3 from the power supply line, is connected to the gate terminal of the transistor 52, which is arranged on the opposite side of the first current source ICH1 from the power supply line, and to the gate terminal of the transistor 24. This enables the application of the second control voltage VP, which is lower than the power supply voltage VCC by the threshold voltage Vth of the transistor 55, to the gate terminal of the transistor 24.

The gate terminal of the transistor 53, which is arranged on the ground line side of the second current source ICH2, is connected to the gate terminal of the transistor 57, which is arranged on the ground line side of the fourth current source ICH4. The gate terminal of the transistor 54, which is arranged on the opposite side of the second current source ICH2 from the ground line, is connected to the gate terminal of the transistor 58, which is arranged on the opposite side of the fourth current source ICH4 from the ground line, and to the gate terminal of the transistor 23. This enables the application of the first control voltage VN, which is higher than the ground level by the threshold voltage Vth of the transistor 57, to the gate terminal of the transistor 23.

This example of a circuit configuration has the advantages described below in addition to the above-described advantages (1) and (2).

(3) In this circuit configuration example, the current sources ICH1 to ICH4 are formed by the respective transistors 51 to 58. The gate terminal of the transistor 55 in the third current source ICH3 is connected to the gate terminal of the transistor 51 in the first current source ICH1. The gate terminal of the transistor 56 in the third current source ICH3 is connected to the gate terminal of the transistor 52 in the first current source ICH1 and to the gate terminal of the transistor 24. The gate terminal of the transistor 53 in the second current source ICH2 is connected to the gate terminal of the transistor 57 in the fourth current source ICH4. The gate terminal of the transistor 54 of the second current source ICH2 is connected to the gate terminal of the transistor 58 in the fourth current source ICH4 and to the gate terminal of the transistor 23.

This wiring enables application, to the gate terminal of the transistor 23, the first control voltage VN that is higher than the ground potential by the threshold voltage Vth of the transistor 57, and enables application, to the gate terminal of the transistor 24, the second control voltage VP that is lower than the power supply voltage VCC by the threshold voltage Vth of the transistor 55. Additionally, the first to fourth current sources ICH1 to ICH4, which are formed with similar circuit configurations, can be formed with a small number of devices.

Second Embodiment

A second embodiment of the present invention will now be described. To avoid redundancy, like or same reference numerals are given to those components that are the same as the corresponding components of the first embodiment. The description centers on parts differing from the first embodiment.

Figure 7:
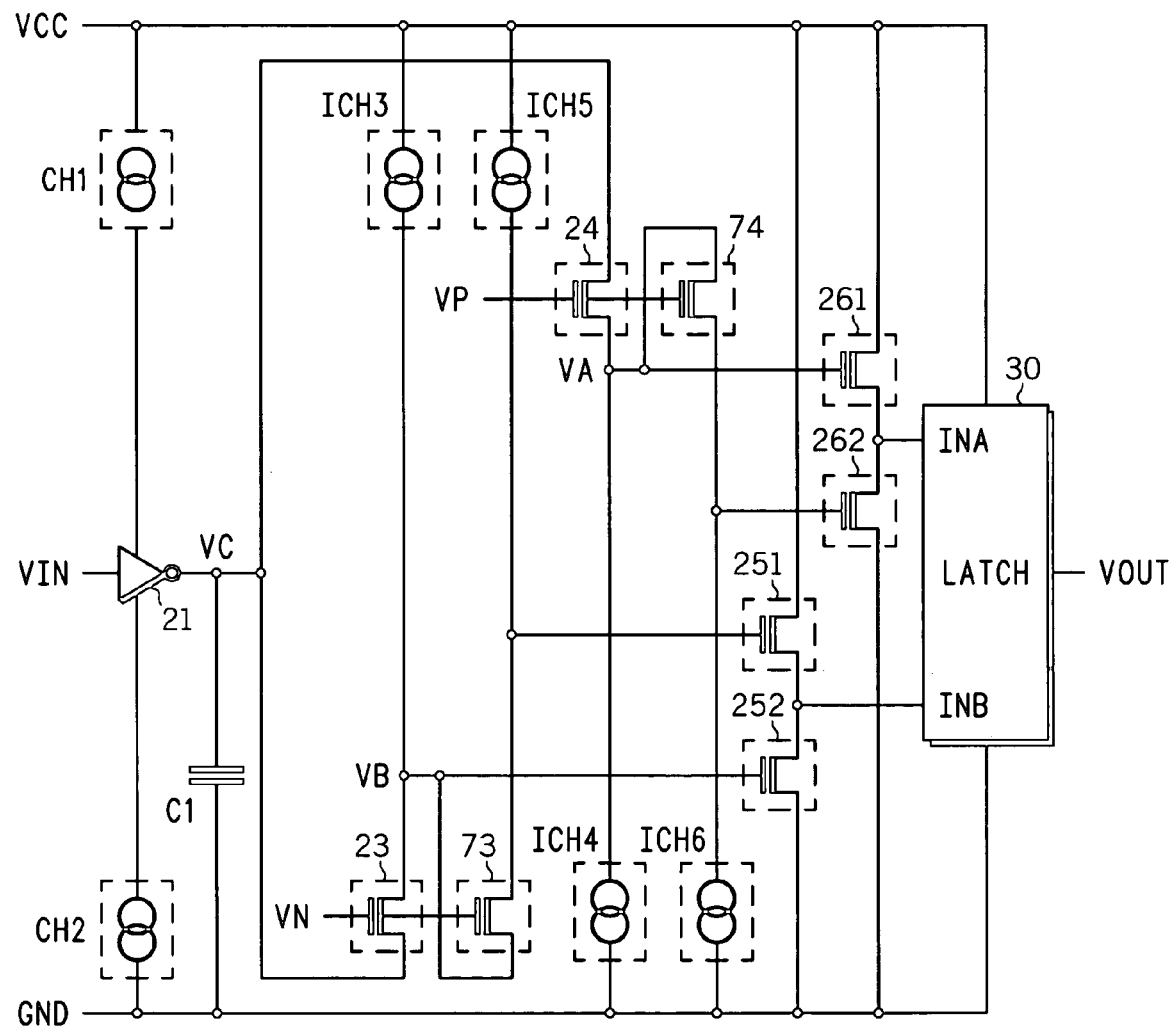
FIG. 7 is a circuit diagram of a deglitch circuit according to a second embodiment of the present invention.

In the second embodiment, as shown in FIG. 7, the inverter 25 of the first embodiment is formed by transistors 251 and 252, and the inverter 26 of the first embodiment is formed by transistors 261 and 262. P-channel MOS transistors are used as the transistors 251 and 261, while N-channel MOS transistors are used as the transistors 252 and 262. The source terminal of the transistor 261 is supplied with a power supply voltage VCC, and the source terminal of the transistor 262 is grounded. The source terminal of the transistor 251 is supplied with the power supply voltage VCC, and the source terminal of the transistor 252 is grounded. The transistors 251, 252, 261, and 262 correspond to third, fourth, fifth, and sixth transistors, respectively.

A transistor 73, which functions as a first auxiliary transistor, has a source terminal connected to the drain terminal of the transistor 23 used in the first embodiment. The drain terminal of the transistor 73 is connected to the power supply line via a fifth current source ICH5, which functions as a first auxiliary current source. The gate terminal of the transistor 73 is common with the gate terminal of the transistor 23. The drain terminal of the transistor 23 is connected to the gate terminal of the transistor 252. A node between the drain terminal of the transistor 73 and the fifth current source ICH5 is connected to the gate terminal of the transistor 251.

A transistor 74, which functions as a second auxiliary transistor, has a source terminal connected to the drain terminal of the transistor 24 used in the first embodiment. The drain terminal of the transistor 74 is grounded via a sixth current source ICH6, which functions as a second auxiliary current source. The gate terminal of the transistor 74 is common with the gate terminal of the transistor 24. The drain terminal of the transistor 24 is connected to the gate terminal of the transistor 261. A node between the drain terminal of the transistor 74 and the sixth current source ICH6 is connected to the gate terminal of the transistor 262.

The second embodiment has the advantages described below in addition to the above-described advantages (1) and (2).

(4) In the second embodiment, the gate voltage of the transistor 251 differs from the gate voltage of the transistor 252 by an amount corresponding to the drop in the voltage of the transistor 73. Therefore, the transistor 251 and the transistor 252 never go ON at the same time. This prevents leak current that would be caused if the transistors 251 and 252 were turned ON simultaneously. Thus, the power consumption is reduced.

(5) In the second embodiment, the gate voltage of the transistor 261 differs from the gate voltage of the transistor 262 by an amount corresponding to the drop in voltage of the transistor 74. Therefore, the transistor 261 and the transistor 262 never go ON at the same time. This prevents leak current that would be caused if the transistors 261 and 262 were turned ON simultaneously. Thus, the power consumption is reduced.

Third Embodiment

Figure 8:
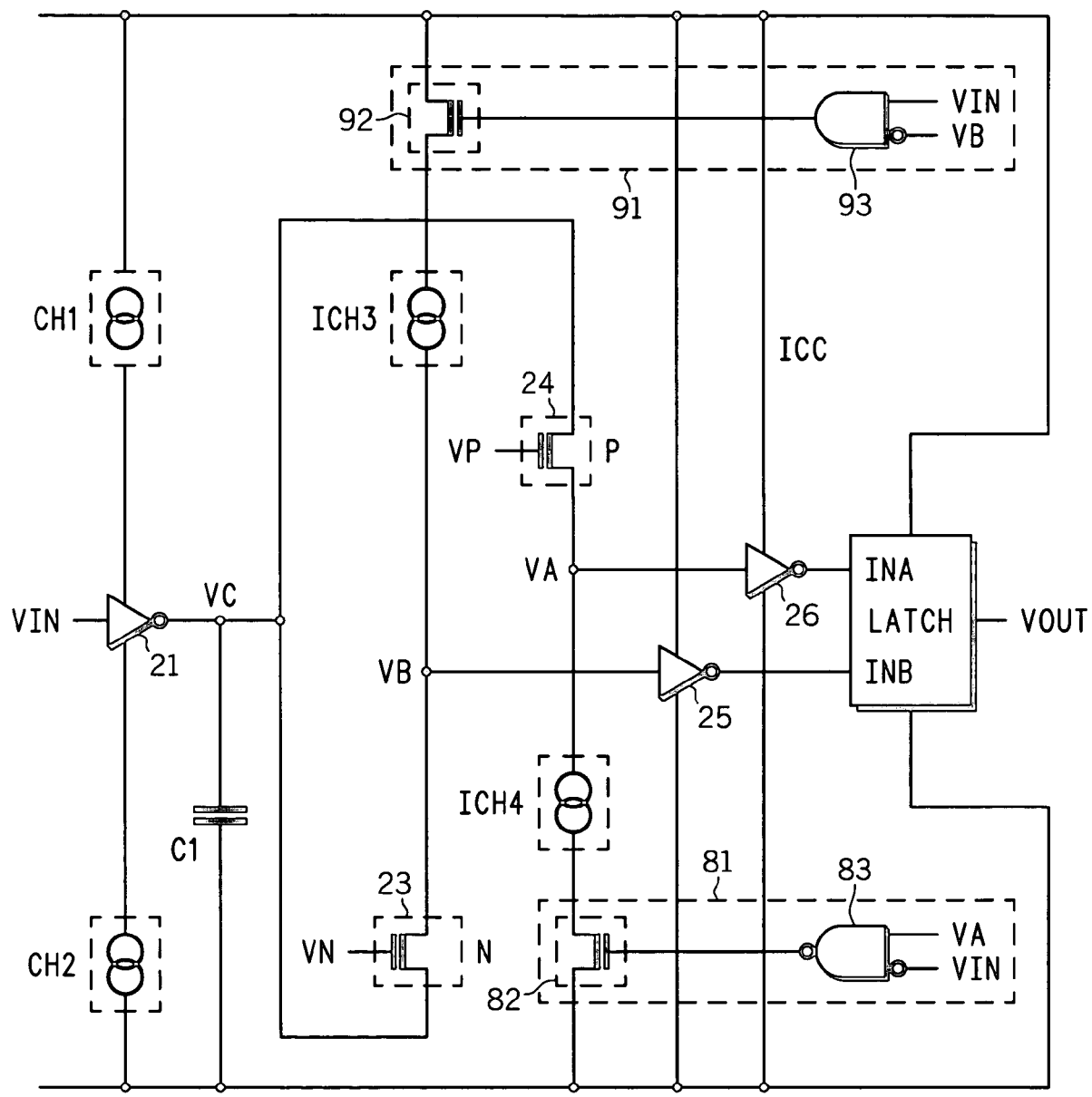
FIG. 8 is a circuit diagram of a deglitch circuit according to a third embodiment of the present invention.
Figure 10A:
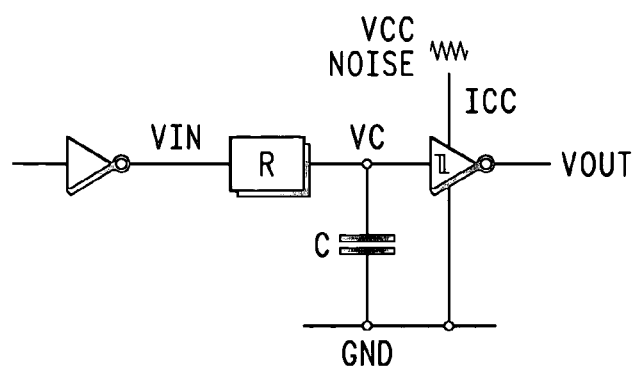
FIG. 10A is a circuit diagram of a deglitch circuit in a first prior art example.
Figure 10B:
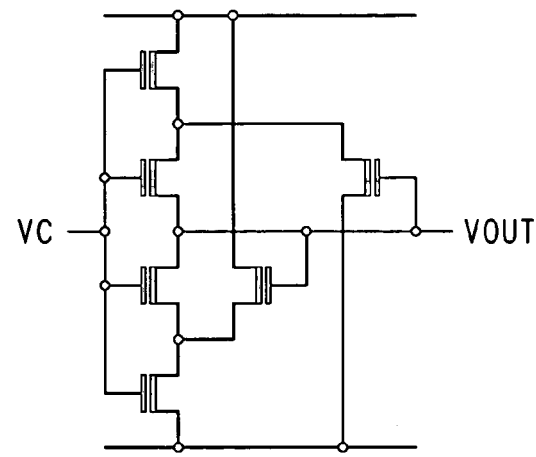
FIG. 10B is a circuit diagram of a Schmitt trigger circuit used in the deglitch circuit of the first prior art example.
Figure 10C:
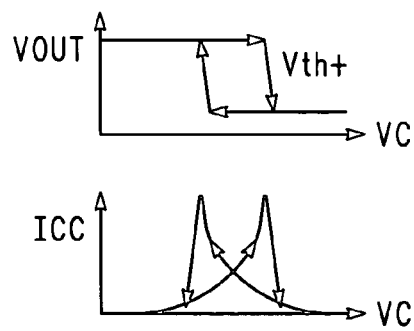
FIG. 10C is a graph showing output changes with respect to voltage VC and changes in power consumption of the Schmitt trigger circuit in the first prior art example.
Figure 10D:
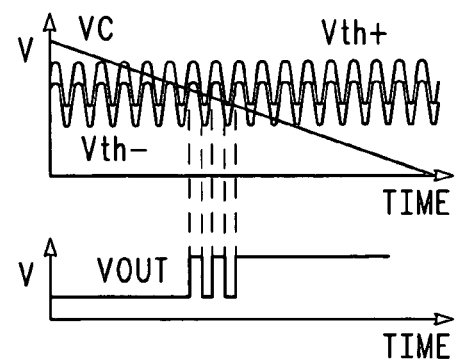
FIG. 10D is a graph showing voltage change and output change in relation to time.
Figure 11A:
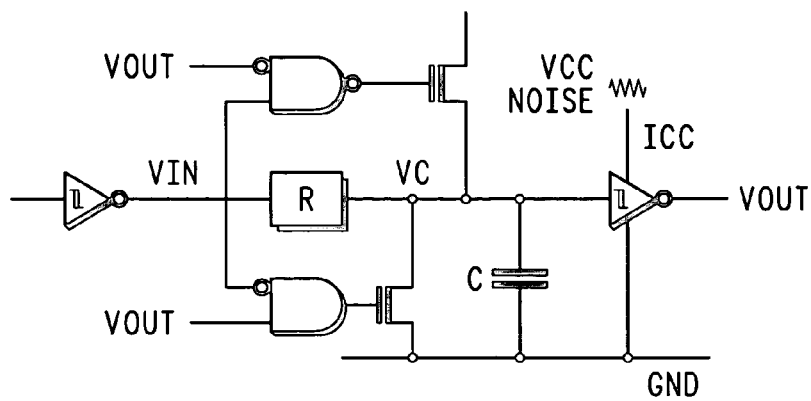
FIG. 11A is a circuit diagram of a deglitch circuit in a second prior art example.
Figure 11B:
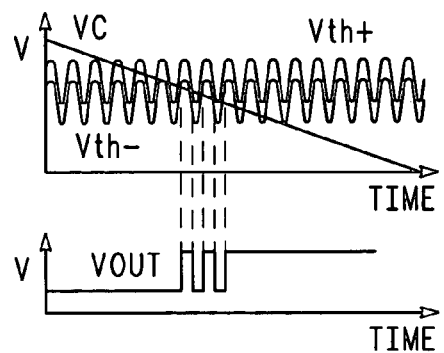
FIG. 11B is a graph showing voltage changes and output changes in the second prior art example.
Figure 12:
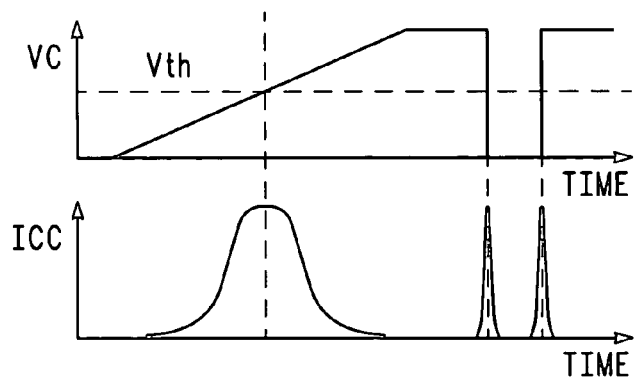
FIG. 12 is a graph showing the relationship between a voltage threshold and consumed current with respect to time.

A third embodiment of the present invention will now be described. As shown in FIG. 8, a deglitch circuit 100 of the third embodiment includes a first local latch circuit 81, which functions as a first switch, and a second local latch circuit 91, which functions as a second switch, that are added to the configuration of the first embodiment.

More specifically, the first local latch circuit 81 includes a transistor 82, which functions as a seventh transistor, and a NAND circuit 83. The transistor 82, which is formed by an N-channel MOS transistor, includes a source terminal that is grounded and a drain terminal connected to the fourth current source ICH4. The gate terminal of the transistor 82 is connected to the output terminal of the NAND circuit 83. The NAND circuit 83 is supplied with the voltage VA. An inverted signal of the input signal voltage VIN of the deglitch circuit 100 is input to the NAND circuit 83. Accordingly, when the voltage VIN of the input signal has an "L" level and the voltage VA has an "H" level, the output signal from the first local latch circuit 81 shifts to an "L" level to turn OFF the transistor 82.

The second local latch circuit 91 includes a transistor 92, which functions as an eighth transistor, and an AND circuit 93. The transistor 92, which is formed by a P-channel MOS transistor, includes a source terminal connected to the power supply line, a drain terminal connected to the third current source ICH3, and a gate terminal connected to the output terminal of the AND circuit 93. The AND circuit 93 is provided with an inverted signal of the voltage VB and the input signal voltage VIN of the deglitch circuit 100. Accordingly, when the input signal voltage VIN has an "H" level and the voltage VB has an "L" level, the output signal of the second local latch circuit 91 shifts to an "H" level to turn OFF the transistor 92.

The third embodiment has the advantages described below in addition to the above-described advantages (1) and (2).

(6) In the third embodiment, the first local latch circuit 81 turns OFF the transistor 82 is turned OFF when the input signal voltage VIN has an "L" level and the voltage VA has an "H" level, that is, when the voltage VA shifts to an "H" level even though the input signal voltage VIN has an "L" level. Therefore, even if the voltage VA is shifted to an "H" level, which functions as a trigger when the output signal voltage VOUT is shifted to an "H" level, the output signal voltage VOUT is kept at an "L" level even if the input signal voltage VIN shifts to an "L" level. Accordingly, the removal of a glitch generated when the input signal voltage VIN has an "L" level is ensured. Additionally, current does not flow from the fourth current source ICH4 when the transistor 82 goes OFF. Thus, power consumption is reduced.

(7) In the third embodiment, the second local latch circuit 91 turns OFF the transistor 92 when the input signal voltage VIN has an "H" level and the voltage VB has an "L" level, that is, when the voltage VB has an "L" level even though the input signal voltage VIN has an "H" level. Therefore, even if the voltage VB is shifted to an "L" level, which functions as a trigger when the output signal voltage VOUT shifts to an "L" level, the output signal voltage VOUT is kept at an "H" level even if the input signal voltage VIN has an "H" level. Accordingly, the removal of a glitch generated when the input signal voltage VIN has an "H" level is ensured. Additionally, current does not flow from the third current source ICH3 when the transistor 92 goes OFF. Thus, power consumption is reduced.

(8) In the third embodiment, the first local latch circuit 81 includes the transistor 82 and the NAND circuit 83. The transistor 82 has a source terminal that is grounded and a drain terminal connected to the fourth current source ICH4. Accordingly, the first switch is formed with a simple configuration to switch between ON and OFF states in accordance with the voltage VA and the inverted signal of the input signal voltage VIN of the deglitch circuit 100.

(9) In the third embodiment, the second local latch circuit 91 includes the transistor 92 and the AND circuit 93. The transistor 92 has a source terminal connected to the power supply line and a drain terminal connected to the third current source ICH3. Accordingly, the second switch is formed with a simple configuration to switch between ON and OFF states in accordance with the voltage VB and the inverted signal of the input signal voltage VIN of the deglitch circuit 100.

It should be apparent to those skilled in the art that the present invention may be embodied in many other specific forms without departing from the spirit or scope of the invention. Particularly, it should be understood that the present invention may be embodied in the following forms.

Although the transistors 73 and 74 are used in the second embodiment, one of the transistors may be eliminated. Further, although the first and second local latch circuits 81 and 91 are used in the third embodiment, one of the transistors may be eliminated. For example, when the occurrence of glitch is biased at an "H" level or an "L" level, one of the transistors may be eliminated. This efficiently removes glitches with a simple circuit configuration.

The configurations of the second embodiment and the third embodiment may be combined. Specifically, the second local latch circuit 91 may be arranged at the power supply line side of the third and fifth current sources ICH3 and ICH5 of the second embodiment, and the first local latch circuit 81 may be arranged at the ground line side of the fourth and sixth current sources ICH4 and ICH6 of the second embodiment. This obtains advantages (1) to (6) at the same time.

In the above embodiments, the first control voltage VN is set to a value that is higher than the ground level by the sum of the threshold voltage Vthn of the transistor 23 and the compliance voltage of the first current source ICH1. Further, the second control voltage VP is set to a value that is lower than the power supply voltage by the sum of the threshold voltage Vthp of the transistor 24 and the compliance voltage of the second current source ICH2. However, the present invention is not limited in such a manner. For example, the first and second control voltages VN and VP may be changed when necessary in accordance with the level of the voltage of a glitch. This ensures the removal of a glitch.

In the above embodiments, the first control voltage VN and the second control voltage VP are applied to the first and second transistor gate terminals, respectively. Thus, the first control voltage VN and the second control voltage VP are appropriately changed to vary the time constant so that a glitch is removed by the time constant corresponding to the noise situation. However, the present invention is not limited in such a manner. For example, current from the current sources such as the first current source ICH1 and second current source ICH2 may be changed to vary the time constant of the deglitch circuit so that the deglitch circuit functions in accordance with the noise situation further effectively.

The present examples and embodiments are to be considered as illustrative and not restrictive, and the invention is not to be limited to the details given herein, but may be modified within the scope and equivalence of the appended claims.

What is claimed is:

1. A deglitch circuit for removing a glitch, the deglitch circuit comprising:
   a first inverter connected to a power supply line, which supplies power supply voltage, via a first current source and to a ground line via a second current source, the first inverter receiving an input signal;
   a capacitor connected to an output terminal of the first inverter and to the ground line;
   a first transistor including a source terminal, connected to the capacitor, and a drain terminal, connected to the power supply line via a third current source having a current value smaller than that of the second current source, the first transistor being biased at a first control voltage that is higher than ground potential;
   a second transistor including a source terminal, connected to the capacitor, and a drain terminal, grounded via a fourth current source having a current value smaller than that of the first current source, the second transistor being biased at a second control voltage that is lower than the power supply voltage;
   a second inverter having an input connected to the source terminal of the first transistor;
   a third inverter having an input connected to the drain terminal of the second transistor; and
   a latch circuit for receiving outputs from the drain terminals of the first and second transistors via the second and third inverters, respectively.

2. The deglitch circuit according to claim 1, wherein:
   the first control voltage is a value approximated to voltage obtained by adding a threshold voltage of the first transistor to the ground potential within a range in which the second current source is operable; and
   the second control voltage is a value approximated to voltage obtained by subtracting a threshold voltage of the second transistor from the power supply voltage within a range in which the first current source is operable.

3. The deglitch circuit according to claim 2, wherein:
   the first transistor is formed by an N-channel MOS transistor;
   the second current source and the fourth current source are each formed by a pair of transistors including two series-connected N-channel MOS transistors; and
   in each of the pairs of the transistors forming the second current source and the fourth current source, the transistor located at a side opposite to the ground line has a gate terminal that is common with a gate terminal of the first transistor.

4. The deglitch circuit according to claim 2, wherein:
   the second transistor is formed by a P-channel MOS transistor;
   the first current source and the third current source are each formed by a pair of transistors including two series-connected P-channel MOS transistors; and
   in each of the pairs of the transistors forming the first current source and the third current source, the transistor located at a side opposite to the power supply line has a gate terminal that is common with the gate terminal of the second transistor.

5. The deglitch circuit according to claim 1, further comprising:
- a first auxiliary transistor including a source terminal connected to the drain terminal of the first transistor, wherein;
- the first auxiliary transistor is biased at the first control voltage and includes a drain terminal connected to a first auxiliary current source;
- the second inverter includes a third transistor formed by a P-channel MOS transistor and a fourth transistor formed by an N-channel MOS transistor; and
- drain terminal voltage of the first transistor is supplied to a gate terminal of the third transistor, and drain terminal voltage of the first auxiliary transistor is supplied to a gate terminal of the fourth transistor.

6. The deglitch circuit according to claim 1, further comprising:
- a second auxiliary transistor including a source terminal connected to the drain terminal of the second transistor, wherein;
- the second auxiliary transistor is biased at the second control voltage and includes a drain terminal connected to a second auxiliary current source;
- the third inverter includes a fifth transistor formed by a P-channel MOS transistor and a sixth transistor formed by an N-channel MOS transistor; and
- drain terminal voltage of the second transistor is supplied to a gate terminal of the fifth transistor, and drain terminal voltage of the second auxiliary transistor is supplied to a gate terminal of the sixth transistor.

7. The deglitch circuit according to claim 1, further comprising:
- a first switch, arranged between the fourth current source and the ground line, for switching in accordance with a NAND output of the drain terminal voltage of the second transistor and an inverted signal of the input signal.

8. The deglitch circuit according to claim 1, further comprising:
- a second switch, arranged between the third current source and the power supply line, for switching in accordance with an AND output of the input signal and an inverted signal of the drain terminal voltage of the first transistor.

* * * * *